(12) United States Patent
Park et al.

(10) Patent No.: US 7,372,766 B2
(45) Date of Patent: May 13, 2008

(54) SEMICONDUCTOR MEMORY DEVICE

(75) Inventors: Ki-Won Park, Suwon-si (KR);
Dong-Hak Shin, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 94 days.

(21) Appl. No.: 11/496,401

(22) Filed: Aug. 1, 2006

(65) Prior Publication Data
US 2007/0036008 A1    Feb. 15, 2007

(30) Foreign Application Priority Data
Aug. 1, 2005   (KR) .................. 10-2005-0070386

(51) Int. Cl.
*G11C 8/00* (2006.01)
(52) U.S. Cl. ............... 365/230.06; 365/63; 365/189.09
(58) Field of Classification Search ........... 365/230.06, 365/63, 189.09
See application file for complete search history.

(56) References Cited

U.S. PATENT DOCUMENTS 6,111,808 A * 8/2000 Khang et al. .......... 365/230.06
6,538,912 B2 * 3/2003 Takemura et al. ............ 365/63

FOREIGN PATENT DOCUMENTS

JP      10-283776      10/1998
KR      100145859 B1   5/1998
KR      1020050031679 A  4/2005

* cited by examiner

*Primary Examiner*—Son Dinh
(74) *Attorney, Agent, or Firm*—Harness, Dickey & Pierce, P.L.C.

(57) ABSTRACT

A semiconductor memory device may include a switching unit to selectively connect a bitline pair and a pair of input/output lines in response to a column selection line signal; a column selection line voltage generator to generate a column selection line voltage; and a column selection line driver to provide the column selection line signal based at least in at the column selection line voltage level.

19 Claims, 7 Drawing Sheets

SEMICONDUCTOR MEMORY DEVICE

PRIORITY STATEMENT

This application claims priority from Korean Patent Application No. 10-2005-0070386 filed on Aug. 1, 2005 in the Korean Intellectual Property Office, the disclosure of which is incorporated herein by reference in its entirety.

BACKGROUND

1. Field of the Invention

The present invention relates to a semiconductor memory device.

2. Description of the Related Art

FIG. 1 illustrates bitline bouncing on a semiconductor memory device.

According to FIG. 1, the semiconductor memory device reads data by the following method: a row address is entered into a circuit and data of a memory cell corresponding to the row address is amplified by a bitline sense amplifier. Then, a bitline pair (BL, BLB) and an input/output line pair (LIO, LIOB) corresponding to a column address are connected, and an input/output sense amplifier then reads the memory cell data. Here, the bitline pair (BL, BLB) and the input/output line pair (LIO, LIOB) are connected by a switching transistor formed between the bitline pair (BL, BLB) and the input/output line pair (LIO, LIOB), which is enabled, by responding to a column selection line signal provided with the decoded column address.

A current type input/output sense amplifier supplies an electric current, and senses any change in the current amount, and reads the memory cell data. The electric current flows into the bitline pair (BL, BLB) via the switching transistor, and one of the bitline pair with a low level, i.e. the bitline bar (BLB), rises to a reference level by the flowed electric current, as denoted by "a" in FIG. 1. However, the other one of the bitline pair with a high level, i.e. the bitline (BL), drops to a reference level, as denoted by "b" in FIG. 1. This rise and drop is referred to as "bitline bouncing". As illustrated in a' and b' in FIG. 1, as the magnitudes of the bitline pair voltages increase, the possibilities of reversing the bitline pair logic levels correspondingly increase. Accordingly, the possibilities of failure increase.

As the semiconductor memory device is highly integrated, a pitch between the bitline pair (BL, BLB) gets closer. As a result, there is not enough space to form the bitline sense amplifier in between the bitline pair (BL, BLB), resulting in a decrease in the number of contacts. In other words, the bouncing voltage rises as the bitline sense amplifier resistance rises.

An internal array source voltage (VINTA) is used in the bitline sense amplifier. As the internal array source voltage (VINTA) level decreases, a potential difference between the bitline pair also decreases when the data stored in a capacitor in the memory cell develops. Therefore, the bitline bouncing may result in higher possibilities of reversing the bitline pair logic levels.

SUMMARY

One or more embodiments of the present invention provide a semiconductor device with enhanced sensing efficiency. This will become apparent to those skilled in the art from the following disclosure.

An embodiment of the present invention provides a semiconductor memory device comprising: a switching unit to selectively connect a bitline pair and a pair of input/output lines, in response to a column selection line signal, a column selection line voltage generator to generate a column selection line voltage exclusively used by the column selection line signal, and a column selection line driver to provide the column selection line signal based at least in part upon the column selection line voltage.

An embodiment of the present invention provides a semiconductor memory device comprising: a switching unit to selectively connect a bitline pair and a pair of input/output lines, in response to a column selection line signal, a column selection line voltage generator to generate a column selection line voltage, and a column selection line driver to provide the column selection line signal based at least in part upon the column selection line voltage.

An embodiment of the present invention provides a semiconductor memory device comprising: a memory cell array having a matrix of memory cells; a plurality of bitline pairs that are arranged in correspondence to columns of the matrix, and that are connected to memory cells in the corresponding columns; a plurality of wordline pairs that are arranged in correspondence to rows in the matrix, and that are connected to memory cells in corresponding rows; a plurality of bitline sense amplifiers, arranged in correspondence to the plurality of bitline pairs, to sense and amplify data of the corresponding bitline pairs; a switching unit to selectively connect the plurality of bitline pairs and the plurality of input/output line pairs in response to a column selection line signal; a column selection line voltage generator to generate a column selection line voltage exclusively used by the column selection line signal; a column selection unit to provide a column selection line signal based at least in part upon the column selection line voltage level, to select an assigned column among the plurality of columns in response to a column address signal; and a plurality of input/output sense amplifiers that are arranged in correspondence to the plurality of input/output line pairs.

An embodiment of the present invention provides a semiconductor memory device comprising: a memory cell array having a matrix of memory cells; a plurality of bitline pairs that are arranged in correspondence to columns of the matrix, and that are connected to memory cells in the corresponding columns; a plurality of wordline pairs that are arranged in correspondence to rows in the matrix, and that are connected to memory cells in corresponding rows; a plurality of bitline sense amplifiers, arranged in correspondence to the plurality of bitline pairs, to sense and amplify data of the corresponding bitline pairs; a switching unit to selectively connect the plurality of bitline pairs and the plurality of input/output line pairs in response to a column selection line signal; a column selection line voltage generator to generate a column selection line voltage; a column selection unit to provide a column selection line signal based at least in part upon the column selection line voltage level, to select an assigned column among the plurality of columns in response to a column address signal; and a plurality of input/output sense amplifiers that are arranged in correspondence to the plurality of input/output line pairs.

In example embodiments, the column selection line signal based exclusively upon the column selection line voltage. In example embodiments, the column selection line signal based on other voltages. In example embodiments, the column selection line signal based at least in part upon the column selection line voltage.

Additional features and advantages of the present invention will be more fully apparent from the following detailed description of example embodiments, the accompanying drawings and the associated claims.

BRIEF DESCRIPTION OF THE DRAWINGS

The above and other features and advantages of the present invention will become more apparent by describing in detail exemplary embodiments thereof with reference to the attached drawings in which.

Figure 1:
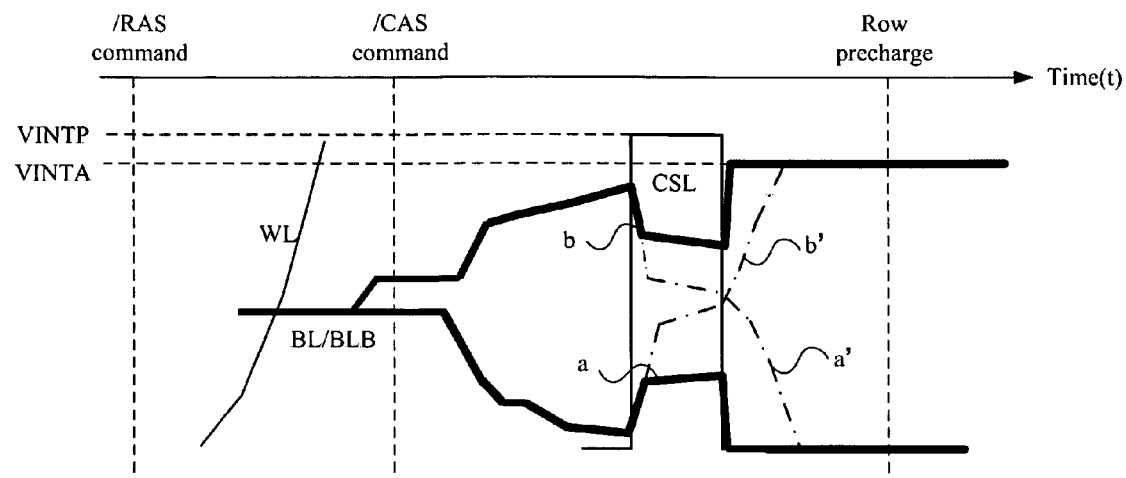
FIG. 1 illustrates bitline bouncing on a semiconductor memory device according to the Related Art.

The accompanying drawings are intended to depict example embodiments of the present invention and should not be interpreted to limit the scope thereof. The accompanying drawings are not to be considered as drawn to scale unless explicitly noted.

DETAILED DESCRIPTION OF EXAMPLE EMBODIMENTS

It will be understood that if an element or layer is referred to as being "on," "against," "connected to" or "coupled to" another element or layer, then it can be directly on, against connected or coupled to the other element or layer, or intervening elements or layers may be present. In contrast, if an element is referred to as being "directly on", "directly connected to" or "directly coupled to" another element or layer, then there are no intervening elements or layers present. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular example embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Figure 2:
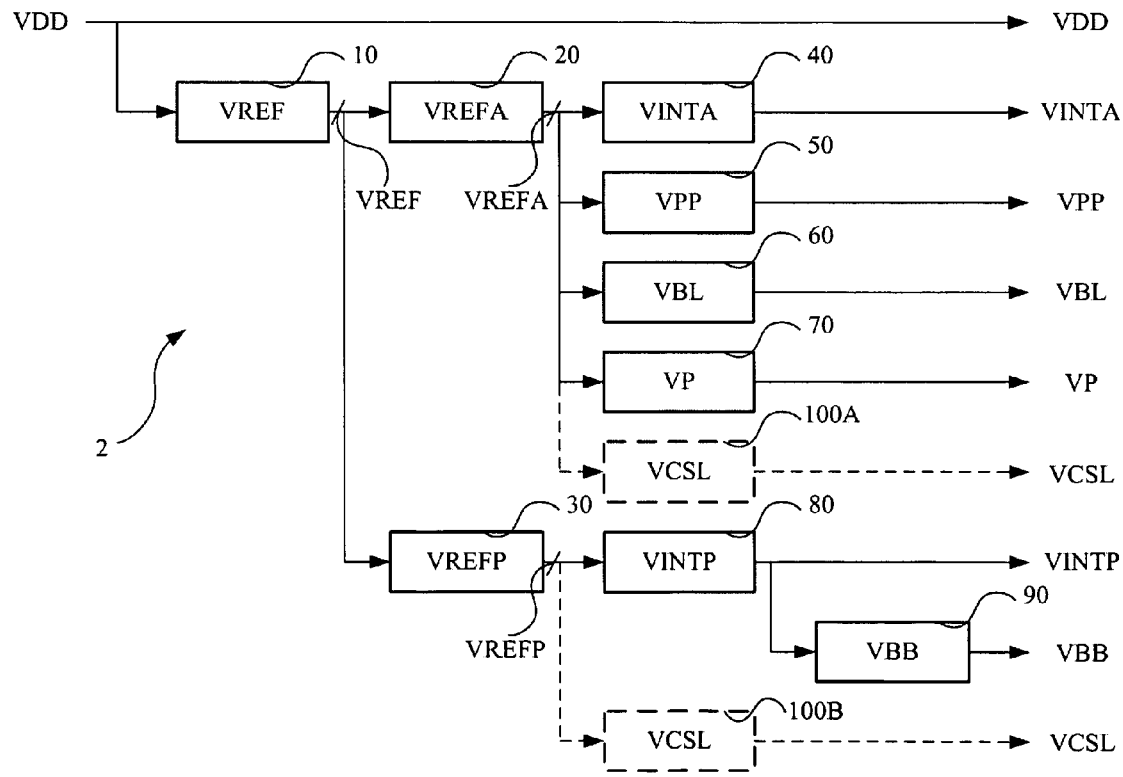
FIG. 2 illustrates a plurality of voltage generators used on a semiconductor memory device according to an example embodiment of the present invention.

FIG. 2 illustrates a plurality of voltage generators used on a semiconductor memory device 2 according to an example embodiment of the present invention.

In reference to FIG. 2, the semiconductor memory device 2 comprises a plurality of voltage generators to generate a source voltage with different levels according to requirements for an operation of an internal circuit. More particularly, the semiconductor memory device 2 comprises a reference voltage (VREF) generator 10; an array reference voltage (VREFA) generator 20; a peripheral circuit reference voltage (VREFP) generator 30; an internal array source voltage (VINTA) generator 40; an boosting voltage (VPP) generator 50; a precharge voltage (VBL) generator 60; a plate voltage (VP) generator 70; an internal peripheral circuit source voltage (VINTP) generator 80; a substrate voltage (VBB) generator 90; and a column selection line (VCSL) voltage generator 100a/100b.

The reference voltage generator 10 generates a reference voltage (VREF) by using a source voltage VDD. The array reference voltage generator 20 generates an array reference voltage (VREFA) by using the reference voltage (VREF). The peripheral circuit reference voltage generator 30 generates a peripheral circuit reference voltage (VREFP) by using the reference voltage (VREF).

The array source voltage generator 40 generates an internal array source voltage (VINTA) by using the array reference voltage (VREFA). The internal array source voltage (VINTA) may be used in a memory cell array, e.g., in a bitline sense amplifier. The peripheral circuit source voltage generator 80 generates an internal peripheral circuit source voltage (VINTP) by using the peripheral circuit reference voltage (VREFP). The peripheral circuit source voltage (VINTP) may be used on a column selection unit, an input/output sense amplifier, and a light circuit.

The internal peripheral circuit source voltage (VINTP) has a higher voltage level relatively to the internal array source voltage (VINTA), which amplifies a gate voltage in a MOS transistor and facilitates fast operations of the peripheral circuit. The lower internal array source voltage (VINTA) improves reliability of a dielectric material on a memory cell capacitor and reliability of a gate insulator on an access transistor, and has a low voltage level in order to reduce power consumption.

The boosting voltage generator 50 generates a boosting voltage (VPP) by using the array reference voltage (VREFA). Such boosting voltage can compensate for a threshold voltage loss of an NMOS transistor, thus is commonly used in a semiconductor memory device. Circuits using a boosting voltage include a wordline driver circuit, a bitline isolation circuit, and a data output buffer circuit. There are different methods of generating a boosting voltage; for example, a boot strapping method is often used because of its relatively low power consumption.

Precharge voltage generator 60 generates a precharge voltage (VBL) by using the array reference voltage (VREFA). The precharge voltage (VBL) is typically used to precharge a bitline pair and has half an internal array source voltage (VINTA) level.

The plate voltage generator 70 generates a plate voltage (VP) by using the array reference voltage (VREFA). The plate voltage (VP) is a voltage typically connected to a standard node on the memory cell capacitor, which reduces voltage leakage by diminishing a potential difference and improving reliability of the capacitor.

The substrate voltage generator 90 generates a substrate voltage (VBB) by using the internal peripheral circuit source voltage (VINTP). Rather than a ground voltage (VSS), the substrate voltage (VBB), e.g., a negative voltage, can be applied to the substrate to reduce (if not minimize) changes in threshold voltage caused by a body effect, amplifies a punch through voltage, and diminishes junction capacitance, to thereby enhance the operation speed.

The semiconductor memory device 2 optionally includes a separate column selection line voltage generator 100A or 100B to generate the column selection line voltage (VCSL) used in generating the column selection line signal by using the peripheral circuit reference voltage (VREFP) or the array reference voltage (VREFA). For example, the column selection line voltage (VCSL) may be generated by dividing the peripheral circuit reference voltage (VREFP) or the array reference voltage (VREFA). The column selection line voltage (VCSL) will be described in more detail below with reference to FIGS. 3, 5, 6 and 8.

The column selection line voltage (VCSL) is independent of the internal peripheral circuit source voltage (VINTP) or the internal array source voltage (VINTA). The voltage level of the column selection line voltage (VCSL) may be lower than that of the internal peripheral circuit source voltage (VINTP) or the internal array source voltage (VINTA).

Figure 3:
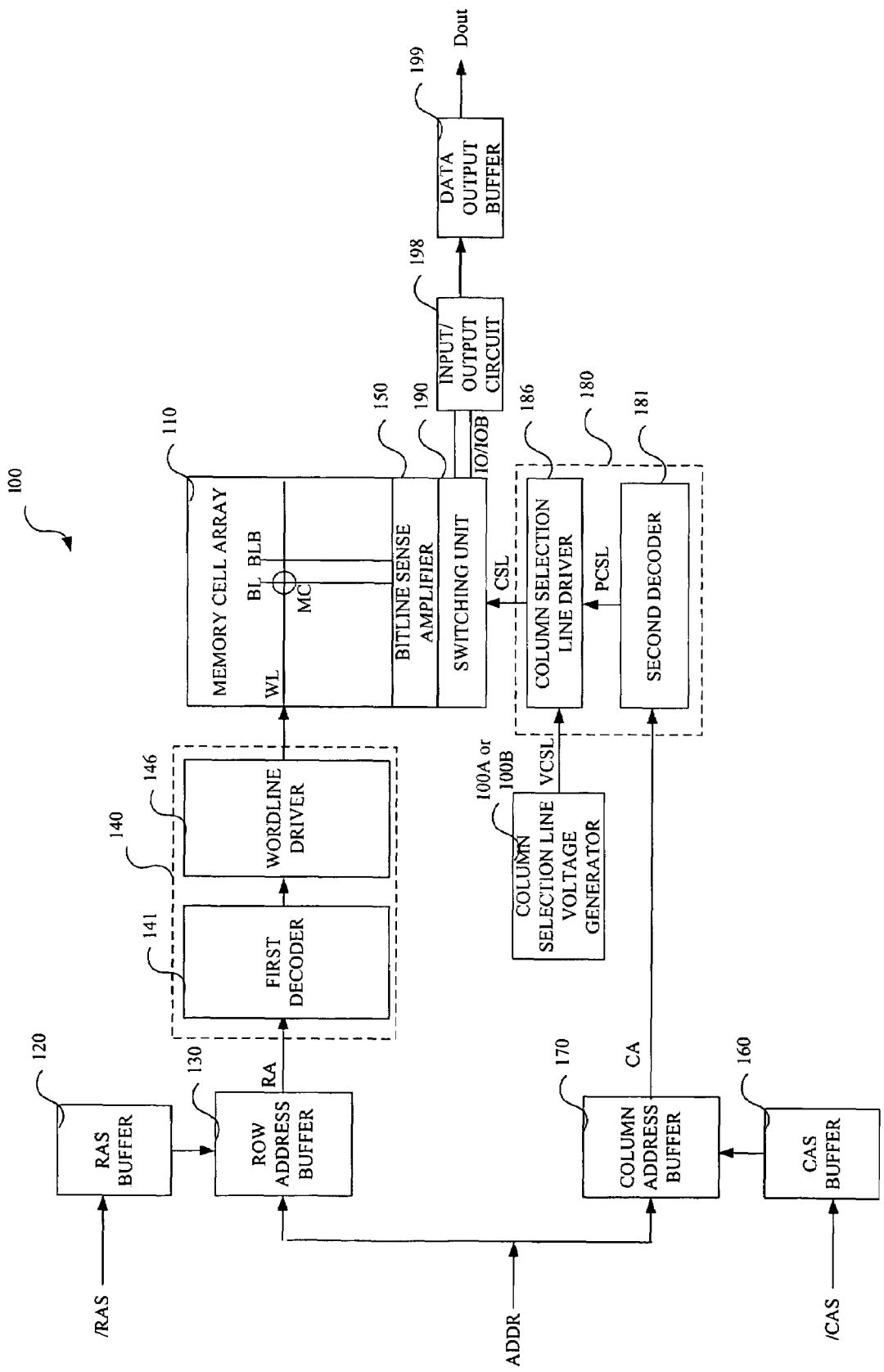
FIG. 3 is a block diagram to describe a semiconductor memory device according to an example embodiment of the present invention.

FIG. 3 is a block diagram to describe a semiconductor memory device 100 according to an example embodiment of the present invention.

According to FIG. 3, the semiconductor memory device 100 comprises a memory cell array 110; an RAS buffer 120; a row address buffer 130; a row selection unit 140; a bitline sense amplifier 150; a CAS buffer 160; a column address buffer 170; a column selection unit 180; a switching unit 190; an input/output circuit 198; and a data output buffer 199.

Memory cells (MCs) are arrayed in the form of a matrix in the memory cell array 110. The memory cells (MCs) in columns are connected to a bitline pair (BL, BLB) corresponding to columns of the matrix and the memory cells (MCs) in rows are connected to a wordline (WL) corresponding to rows of the matrix.

The row address buffer 130, in response to an internal RAS signal which represents a version of a row address strobe (RAS) produced by the RAS buffer 120, sends a read address (RA) signal to a row selection unit 140 by buffering the external address (ADDR). An inverter type passive address buffer or a cross-couple type active address buffer may be used as the row address buffer 130.

The row selection unit 140 is provided with a first decoder 141 and a first wordline driver 146, and is operable to select an assigned row among the plurality of rows according to the row address signal (RA). The first decoder 141 is provided with a pre-decoder and a main decoder that together decode the row address signal (RA), and is operable to provide an output signal to the wordline driver 146. The wordline driver 146 charges a wordline gate voltage that corresponds to the output signal provided by the first decoder 141. That is, when the wordline is activated, the bitline pair (BL, BLB) and the memory cell (MC) are electrically connected and data from corresponding memory cell data is sent to the bitline pair (BL, BLB).

A plurality of bitline sense amplifiers 150 are arranged in correspondence to a plurality of bitline pairs (BL, BLB), and differentially amplify respective voltage differences.

A column address strobe signal (CAS) is received and buffered by the CAS buffer 160. The column address buffer 170 receives and "latches" the external address (ADDR) according to column address strobe (CAS) signal from the CAS buffer 160.

The column selection unit 180 is provided with a second decoder 181 and a second column selection line driver 186, and is operable to select an assigned column among the plurality of columns according to a column address signal (CA). The second decoder 181 is provided with a pre-decoder and a main decoder, and is operable to decode the column address signal (CA) and provide an output signal (PCSL) to the column selection line driver 186. The column selection line driver 186 responds to the output signal (PCSL) and provides a column selection line signal (CSL) in a level of column selection line voltage (VCSL) to the switching unit 190. Again, the column selection line voltage (VCSL) is provided by the column selection line voltage generator 100A or 100B.

The switching unit 190 responds to the column selection line signal (CSL) and electrically connects the bitline pair (BL, BLB) with the input/output line pair (IO, IOB), which enables the input/output circuit 198 to read data amplified by the bitline sense amplifier 150.

Figure 4:
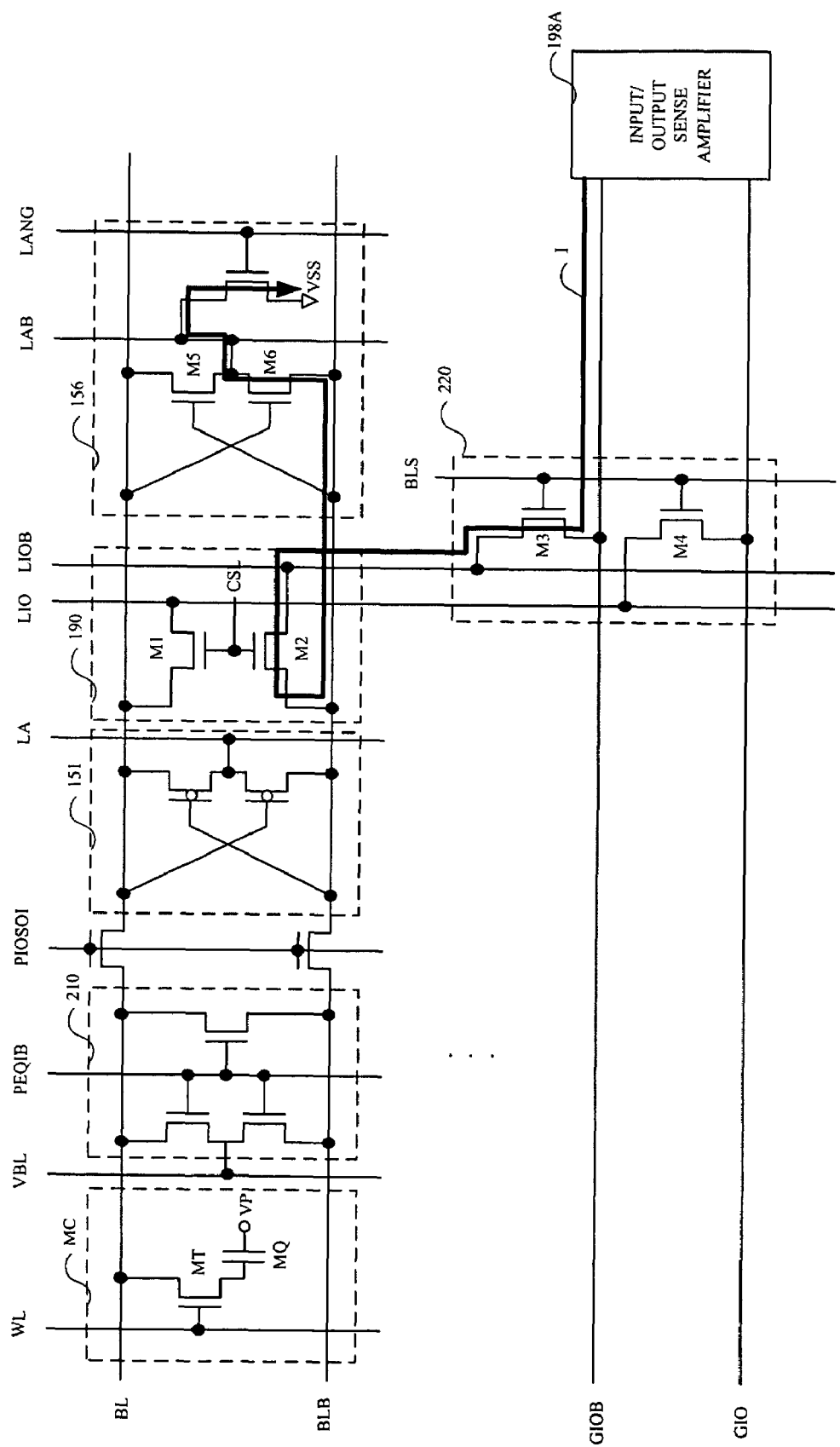
FIG. 4 is a circuit diagram approximately illustrating in more detail (according to an example embodiment of the present invention) configurations of circuit elements in a single column relevant to a reading process of a semiconductor memory device.

FIG. 4 is a circuit diagram approximately illustrating in more detail (according to an example embodiment of the present invention) configurations of circuit elements in a single column relevant to a reading process of a semiconductor memory device, e.g., 2.

More particularly, FIG. 4 corresponds to the input/output line pair (IO/IOB) illustrated in FIG. 2, and which is hierarchically classified into a local input/output line pair (LIO, LIOB) and a global input/output line pair (GIO, GIOB).

According to FIG. 4, memory cell (MC) data of the semiconductor memory device 2 is sent to an input/output sense amplifier 198A on the input/output circuit 198 illustrated in FIG. 3 through a bitline pair (BL, BLB), the local input/output line pair (LIO, LIOB), and the global input/output line pair (GIO, GIOB).

The memory cell (MC) is arrayed in correspondence to the intersection in which a wordline (WL) and the bitline (BL) cross, and includes a memory cell capacitor (MQ) that retains information and an access transistor (MT), which is formed between the memory cell capacitor (MQ) and the bitline (BL), and is gated by a wordline (WL) signal. One of the nodes of the memory cell capacitor (MQ) supplies a plate voltage (VP) and either a positive charge or a negative charge accumulates on the other node of the memory cell capacitor (MQ) based thereupon.

An equalizer circuit 210 connects the bitline pair (BL, BLB) and so does the bitline sense amplifier 150 (see discussion below), which is illustrated in FIG. 3. The equalizer 210 responds to an equalizing signal (PEQIB) and precharges the bitline pair (BL, BLB) to a precharge voltage (VBL) of half the internal array source voltage (VINTA). The equalizing signal (PEQIB) is enabled on standby and disabled while active.

The bitline amplifier 150, comprising a PMOS type sense amplifier 151 and an NMOS type senses amplifier 156, develops the bitline pair (BL, BLB) data. In other words, the PMOS type sense amplifier 151 develops high level data as a voltage (LA) increases while the NMOS type sense amplifier 156 develops low level data in response to a bitline sense amplifier enable signal (LANG) as a voltage (LAB) decreases.

A switching unit comprising transistors M1 and M2, formed between the bitline pair (BL, BLB) and the local input/output line pair (LIO, LIOB), responds to a column selection line signal (CSL), to thereby electrically connect the bitline pair (BL, BLB) and the local input/output line pair (LIO, LIOB).

A local-global multiplexer 220 comprises NMOS transistors M3 ad M4, is formed between the local input/output line pair (LIO, LIOB) and the global input/output line pair (GIO, GIOB), and responds to a block selection signal (BLS) to thereby electrically connect the local input/output line pair (LIO, LIOB) and the global input/output line pair (GIO, GIOB).

The operations are carried out in the following manners:

As the equalizing signal (PEQIB) level is high on standby, the equalizing circuit 210 is enabled to precharge the bitline pair (BL, BLB) to the precharge voltage (VBL). In addition, the wordline is in an unselected status and the column selection line signal (CSL) goes down to a lower level.

When a read operation is initiated on the read command, the wordline driver 146 illustrated in FIG. 3 drives the wordline (WL) to a selected status according to a timing scheme. The equalizing signal (PEQIB) is deactivated causing the bitline pair (BL, BLB) to float. As a result, the electric charge accumulated in the memory cell capacitor (MQ) is sent to the bitline (BL).

When the electrical charge accumulated in the memory cell capacitor (MQ) is sent to the bitline pair (BL, BLB) and the potential difference of the bitline pair (BL, BLB) is magnified, the bitline sense amplifier enable signal (LANG) reaches to a high level causing the voltage (LAB) to drop to the ground voltage level (VSS), and the voltage (LA) to rise to the internal array source voltage (VINTA) level.

When the voltage level of the bitline pair (BL, BLB) is fully developed by the bitline sense amplifier 150, the column selection line signal (CSL) in the column selection line amplifier (VCSL) goes up, which causes the switching transistors M1 and M2 on the switching unit 190 to be turned on, thereby electrically connecting the bitline pair (BL, BLB) and the local input/output line pair (LIO, LIOB). In addition, the block selection signal (BLS) is also turned on, thereby electrically connecting the local input/output line pair (LIO, LIOB) and the global input/output line pair (GIO, GIOB). Therefore, the input/output sense amplifier 198A in the input/output circuit 198 illustrated in FIG. 3 becomes capable of sensing the stored data.

Taking the current input/output sense amplifier 198A for example to describe the sensing method, the input/output sense amplifier 198A supplies the electric current to the global input/output line pair (GIO, GIOB) and senses the current difference caused by the potential difference of the bitline pair (BL, BLB). Specifically, the current provided to the input/output sense amplifier 198A goes out to the ground voltage (VSS) via the global input/output line pair (GIO, GIOB), the local multiplexer 220, the local input/output line pair (LIO, LIOB), the switching unit 190, the bit line pair (BL, BLB), and NMOS transistors M5 and M6 in the bitline sense amplifier 150. As mentioned above, since the bitline (BL) is at the high level of the internal array source voltage (VINTA) and the bitline bar (BLB) is at the low level of the ground voltage (VSS), when the column selection line signal (CSL) raised to be at the high level, more current flows via the switching transistor M2 than via the switching transistor M1 on the switching unit 190. Therefore, the input/output sense amplifier 198A senses the current difference, and reads the stored data in the memory cell (MC).

The electric current provided by the input/output sense amplifier 198A flows into the bitline pair (BL, BLB), such supplied current causes the voltage level of the bitline pair (BL, BLB) to fluctuate. That is, one of the bitline pair with a low level, e.g., the bitline (BL), rises to a first reference level by the supplied current and the other one of the bitline pair with a high level, e.g., the bitline bar (BLB), drops to a second reference level. Such a condition is called bitline bouncing. As the magnitudes of the bitline pair voltages increase, the possibilities of reversing the bitline pair logic levels correspondingly increase. Accordingly, the possibilities of failure increase.

Increasing the internal array source voltage (VINTA) level is used to lower the possibilities of the failure. The voltage difference of the developed bitline pair is magnified in such a case as the internal array source voltage (VINTA) is used in the PMOS type sense amplifier 151. Consequently, the possibilities of reversing the logic levels can be decreased even with the same bouncing voltage level. Increasing the internal array source voltage (VINTA) level, however, can be undesirable in that it goes against a recent trend in low power consumption as it consumes additional power. Operations carried out in other circuits using the internal array source voltage (VINTA) can be considered. Reducing the bouncing voltage level may be used to lower the possibilities of the failure. This can be done by adjusting the voltage level of the column selection line signal (CSL).

Figure 5:
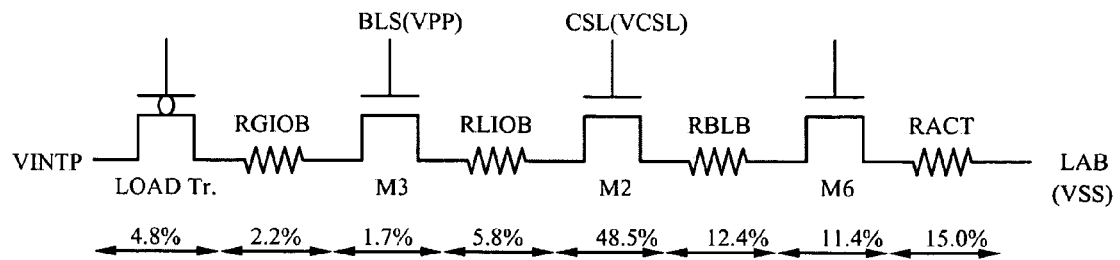
FIG. 5 is a drawing illustrating in more detail (according to an example embodiment of the present invention) voltage division according to a path from an input/output sense amplifier and a bitline sense amplifier.

FIG. 5 is a drawing illustrating (in more detail according to an example embodiment of the present invention) voltage division according to a path from an input/output sense amplifier and a bitline sense amplifier. That is, FIG. 5 illustrates only the voltage division according to the current path denoted by "I" in FIG. 4 for consistency of descriptions.

In FIG. 5, specifically, the electrical current provided from the input/output sense amplifier 198A goes out to a ground voltage (VSS) through a path including: a load transistor in the input/output sense amplifier 198A; a global input/output line bar; an NMOS transistor M3 in a local-global multiplexer 220; a local input/output line bar; a switching transistor M2 in a switching unit; a bitline bar; and an NMOS transistor M6 in a bitline sense amplifier 150.

The voltage division in the path from the load transistor in the input/output line sense amplifier 198A to the NMOS transistor M6 can be expressed as one of sample (i.e., non-limiting) percentages in FIG. 5, in which: RGIOB stands for a resistance of the global input/output line (GIOB); RLIOB stands for a resistance of the local input/output line bar (LIOB); RBLB stands for a resistance of the bitline bar (BLB); and RACT stands for an active resistance of the NMOS type sense amplifier 156. As illustrated in FIG. 4, the switching transistor M2 in the switching unit 190, which is enabled in response to the column selection line signal (CSL), is where the voltage division is most actively occurs. Therefore, a maximum result can be achieved by adjusting the resistance of the switching transistor M2 in the switching unit 190.

Since the bitline bouncing voltage (RBLB1) can be computed by a sum of RBLB1, the resistance of the switching transistor M2 (RACT) and the RACT multiplied by the supplied current squared, it is observed that the smaller the amount of current that enters, the lower the bitline bouncing that is exhibited. Therefore, by increasing the resistance of the switching unit 190 and thus decreasing the current flowing into it, the bitline bouncing voltage can be lowered.

In FIG. 4, the resistance of the switching unit 190 is adjusted by adjusting the voltage level of the column selection line signal (CSL). In the Related Art, the column selection line signal (CSL) was formed by using an internal peripheral circuit source voltage (VINTP), wherein adjustment of the voltage level of the column selection line signal (CSL) was accomplished by adjusting the internal peripheral circuit source voltage (VINTP), which significantly restricted the range of adjustment. Therefore, in the presently disclosed semiconductor memory device 2, the voltage level of the column selection line signal (CSL) is made more robustly adjustable by additionally using the column selection line voltage generators 100A and 100B, which generate the column selection line voltage (VCSL) for the column selection line signal (CSL) as a function of the array reference voltage (VRFFA) and of the peripheral circuit reference voltage (VREFP), respectively.

The column selection line voltage (VCSL), (again) used for the column selection line signal (CSL), should be adjusted according to sensing abilities of the input/output sense amp 198A and that of the bitline sense amp 150. For example, if the input/output sense amp 198A has a good sensing ability, the voltage level of the column selection line voltage (VCSL) can easily be lowered.

Figure 6:
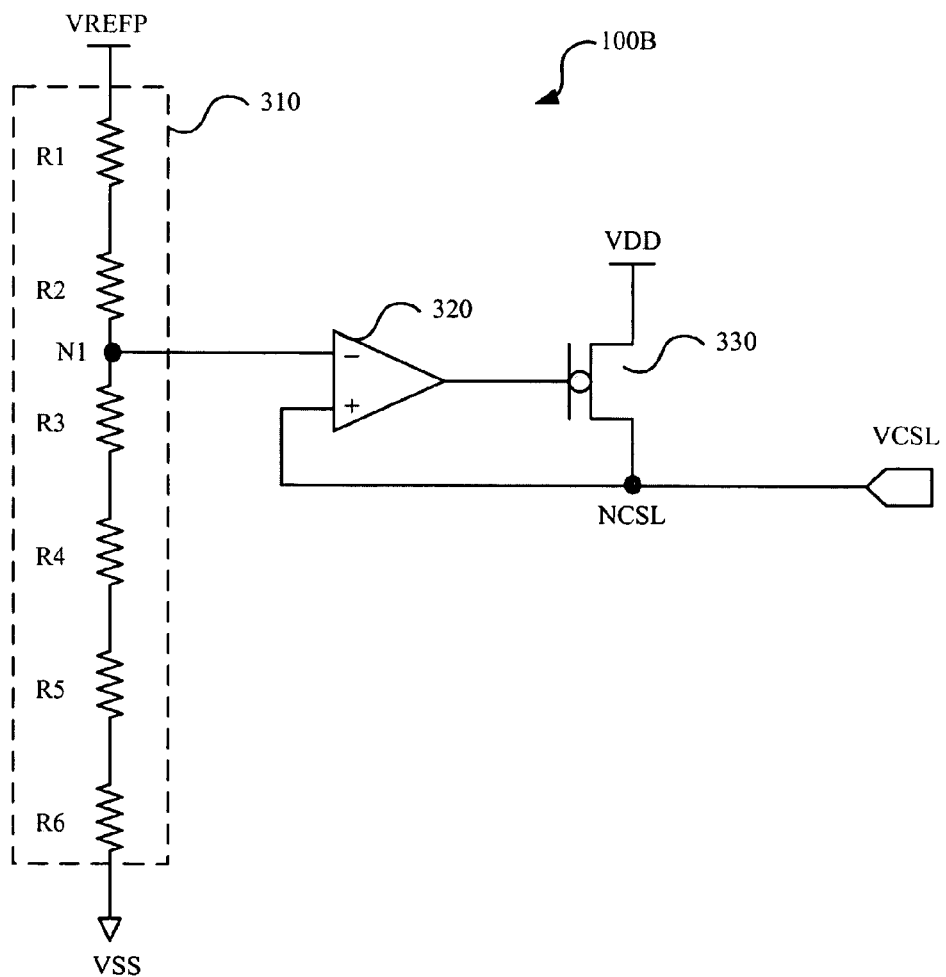
FIG. 6 is a circuit diagram illustrating in more detail (according to an example embodiment of the present invention) the column selection line voltage generator illustrated in FIG. 3.

FIG. 6 is a circuit diagram illustrating in more detail (according to an example embodiment of the present invention) a column selection line voltage generator 100A or 100B illustrated in FIG. 3.

According to FIG. 6, the column selection line voltage generator 100A or 100B generates a column selection line voltage (VSCL) by dividing a peripheral circuit reference voltage (VREFP) or an array reference voltage (VREFA). The column selection line voltage (VCSL) should be lower than the peripheral reference voltage (VREFP) or the array reference voltage (VREFA). Whether the column selection line voltage generator uses the peripheral reference voltage (VREFP) or the array reference voltage (VREFA), the actual circuit configurations can be identical. Hence (for simplicity), FIG. 6 presumes the circumstance that uses the peripheral circuit reference voltage (VREFP) as an example.

The column selection line voltage generator 100B comprises a voltage divider circuit 310, a resistance string, e.g., dividing the peripheral circuit reference voltage (VREFP), a differential amplifier 320 differentially amplifying a first node (N1) voltage on the resistance string 310 and a voltage of a column selection line voltage output node (NCSL), and a PMOS current driving transistor 330 providing (via its source being connected to VSS) the current to the column selection line voltage output node (NCSL) (connected to its drain) according to the differential amplifier 320 output received on its gate.

If the first node (N1) voltage on the resistance string is greater than the voltage level of the column selection line voltage output node (NCSL), the differential amplifier 320 provides a high level output signal disabling the current driving transistor 330. On the other hand, the differential amplifier 320 provides a low level output signal enabling the current driving transistor 330 if first node (N1) voltage on the resistance string is lower than the voltage level of the column selection line voltage output node (NCSL). Alternatively, the column selection line voltage generator 100B could be based upon an NMOS transistor, i.e., the current driving transistor 330 could be an NMOS transistor, etc.

Figure 7:
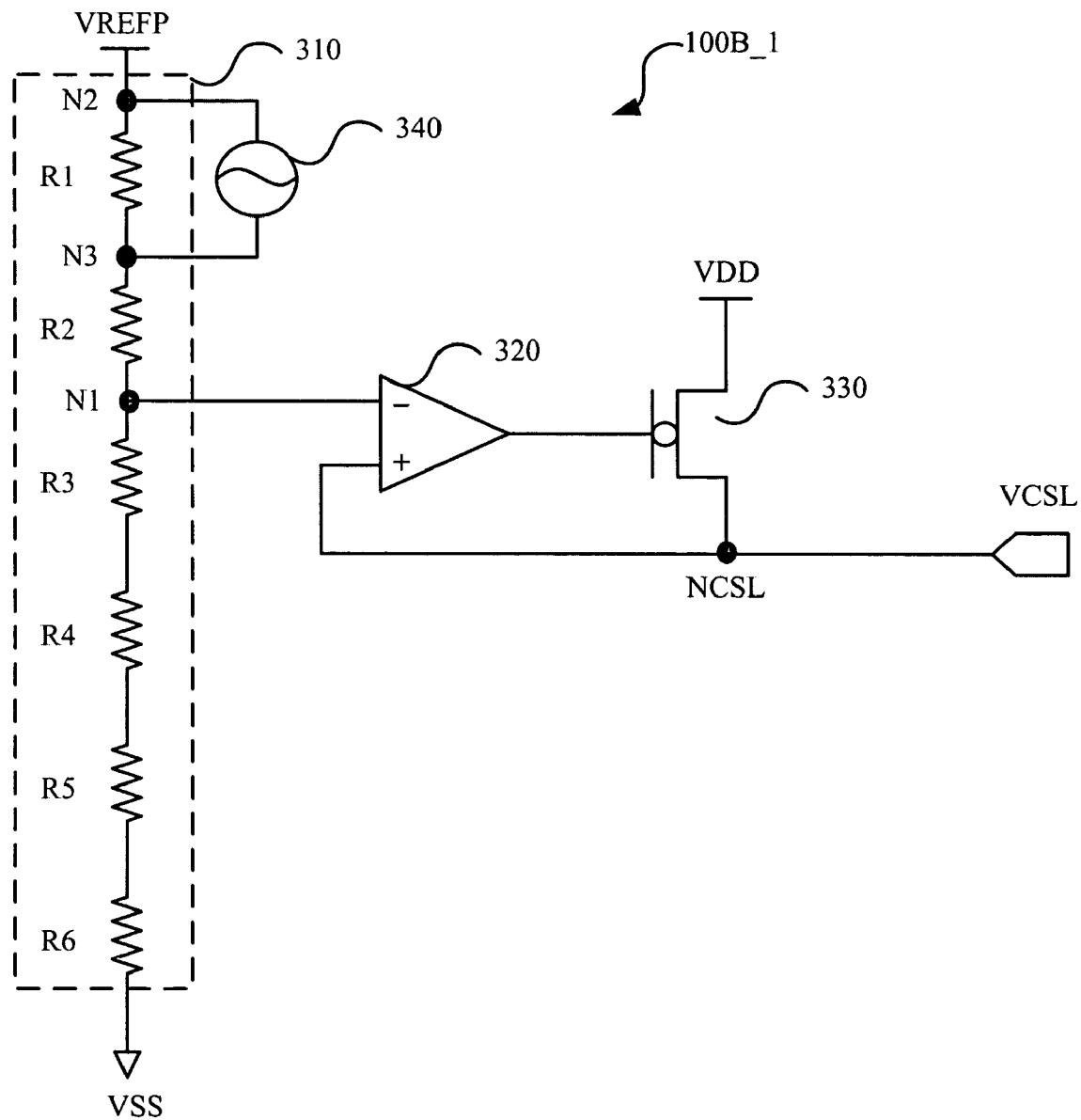
FIG. 7 is another circuit diagram illustrating in more detail (according to an example embodiment of the present invention) a version of the column selection line voltage generator illustrated in FIG. 6.

FIG. 7 is another circuit diagram illustrating in more detail (according to an example embodiment of the present invention) a version 100B_1 of the column selection line voltage generator 100B or 100A illustrated in FIG. 6. Like reference numerals designate like elements in FIG. 6 and FIG. 7 and the details thereof will not be hereinafter described.

According to FIG. 7, the voltage divider circuit 310 of the column selection line voltage generator 100B_1 further comprises a fuse 340 that connects together a second node (N2) and a third node (N3) to adjust a column selection line voltage (VCSL). For example, if a test is carried during the semiconductor memory device fabrication process and the column selection line voltage (VCSL) level turns out to be greater than it should be, then the fuse 340 may be severed to decrease VCSL. Using such a method can improve (if not maximize) the sensing efficiency by adjusting the column selection line voltage (VCSL) according to an individual characteristic feature of the semiconductor memory device being fabricated.

Figure 8:
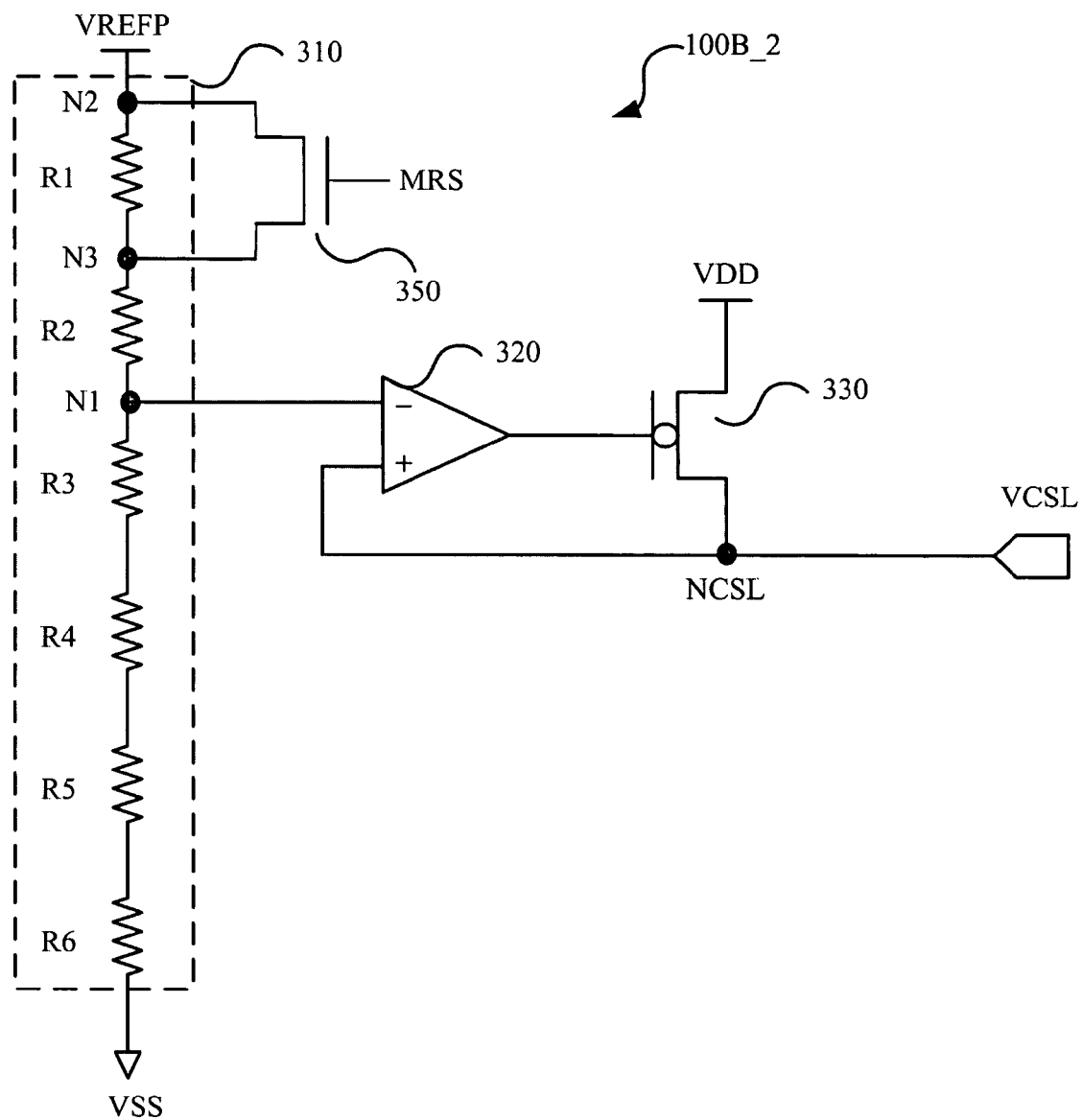
FIG. 8 is another circuit diagram illustrating in more detail (according to an example embodiment of the present invention) a version of the column selection line voltage generator illustrated in FIG. 6.

FIG. 8 is another circuit diagram illustrating in more detail (according to an example embodiment of the present invention) a version 100B_2 of the column selection line voltage generator 100B or 100A illustrated in FIG. 6. Like reference numerals designate like elements in FIG. 6 and FIG. 8 and the details thereof will not be hereinafter described.

According to FIG. 8, the voltage divider circuit 310 of the column selection line voltage generator 100B_2 further comprises an NMOS transistor 350 to selectively connect together a second node (N2) and a third node (N3) to adjust a level of a column selection line voltage (VCSL). The NMOS transistor 350 is gated in response to a mode resister set (MRS) signal. Therefore, when the NMOS transistor 350 is switched on by the high level mode resister set signal (MRS), the voltage level of the column selection line voltage (VCSL) rises. The voltage level of the column selection line voltage (VCSL) may be adjusted by using such a method.

Figure 9:
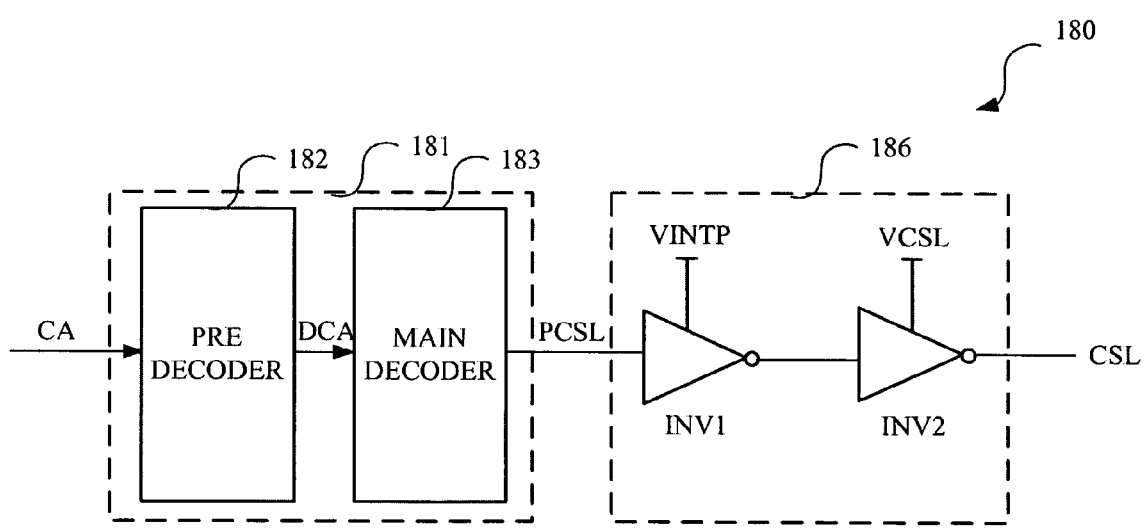
FIG. 9 illustrates in more detail (according to an example embodiment of the present invention) the column selection unit illustrated in FIG. 3.

FIG. 9 illustrates the column selection unit 180 in more detail (according to an example embodiment of the present invention) illustrated in FIG. 3.

It is to be recalled that the column selection unit 180 comprises a second decoder 181 and a column selection line driver 186.

In FIG. 9, the second decoder 181 comprises a predecoder 182 and a main decoder 183. The predecoder 182 decodes a column address signal (CA) and provides a column address selection signal (DCA) to the main decoder 183. The main decoder 183 decodes the column address selection signal (DCA) and provides an output signal (PCSL) to the column selection line driver 186.

The column selection line driver 186 then receives the main decoder 183 output signal (PCSL), converts the PCSL into the column selection line signal (CSL) based upon the internal peripheral circuit source voltage (VINTP) and the column selection line voltage level (VCSL), and provides the VCSL to a column selection line signal (CSL). That is, the column selection line driver 186 comprises two inverters (INV1 and INV2) connected in series in which: the first inverter (INV1) uses an internal peripheral circuit source voltage (VINTP) level as a source of power and converts the main decoder 183 output signal (PCSL) into a first inverter (INV1) out signal. The second inverter (INV2) uses the column selection line voltage (VCSL) level as a source of power and converts the first inverter (INV1) output signal into the column selection line voltage (VCSL) level. In an example embodiment, the column selection line signal (CSL) may be based upon the internal peripheral circuit source voltage (VINTP) or the internal array source voltage (VINTA).

As described above, a voltage generating circuit on a semiconductor memory according to one or more embodiments of the present invention can provide the following effect(s).

By using a column selection line voltage for a column selection line signal, a column selection line signal voltage level may be easily adjusted, e.g., via a switching transistor resistance in a switching unit, which selectively connects a bitline pair and a local input/output pair. This can prevent reversing of bitline pair logic levels caused by the bitline bouncing, thereby enhancing reliability of the semiconductor memory device.

With some embodiments of the present invention having thus been described, it will be obvious that the same may be varied in many ways. Such variations are not to be regarded as a departure from the spirit and scope of the present invention, and all such modifications are intended to be included within the scope of the present invention.

What is claimed:

1. A semiconductor memory device comprising:
   a switching unit to selectively connect a bitline pair and a pair of input/output lines in response to a column selection line signal;
   a column selection line voltage generator to generate a column selection line voltage exclusively used by the column selection line signal; and
   a column selection line driver to provide the column selection line signal based at least in part upon the column selection line voltage level.

2. The device of claim 1, wherein the column selection line voltage is independent of an internal peripheral circuit source voltage or an internal array source voltage.

3. The device of claim 1, wherein the column selection line voltage is lower than an internal peripheral circuit source voltage or an internal array source voltage.

4. The device of claim 1, wherein the column selection line voltage is generated by using a peripheral circuit reference voltage or an array reference voltage.

5. The device of claim 4, wherein the column selection line voltage generator comprises:
   a voltage divider circuit to divide the internal peripheral circuit reference voltage or internal array reference voltage;
   a differential amplifier that differentially amplifies a first node voltage in the voltage divider circuit and a voltage of a column selection line voltage output node; and;
   a current driving transistor that provides current to the column selection line voltage output node in response to an output signal of the differential amplifier.

6. The device of claim 5, wherein the column selection line voltage generator further comprises a fuse to connect a second node and a third node in the voltage divider circuit.

7. The device of claim 5, wherein the column selection line voltage generator further comprises a transistor connected between the second node and the third node in the voltage divider circuit, which is turned on/off in response to a mode resister set signal.

8. A semiconductor memory device comprising:
   a memory cell array having a matrix of memory cells;
   a plurality of bitline pairs that are arranged in correspondence to columns of the matrix, and that are connected to memory cells in the corresponding columns;
   a plurality of wordline pairs that are arranged in correspondence to rows in the matrix, and that are connected to memory cells in corresponding rows;
   a plurality of bitline sense amplifiers, arranged in correspondence to the plurality of bitline pairs, to sense and amplify data of the corresponding bitline pairs;
   a switching unit to selectively connect the plurality of bitline pairs and the plurality of input/output line pairs in response to a column selection line signal;
   a column selection line voltage generator to generate a column selection line voltage exclusively used by the column selection line signal;
   a column selection line unit to provide a column selection line signal based at least in part upon the column selection line voltage level for selection of an assigned column among the plurality of columns in response to a column address signal; and
   a plurality of input/output sense amplifiers that are arranged in correspondence to the plurality of input/output line pairs.

9. The device of claim 8, wherein the column selection line voltage is independent of an internal peripheral circuit source voltage or an internal array source voltage.

10. The device of claim 8, wherein the column selection line voltage is lower than an internal peripheral circuit source voltage or an internal array source voltage.

11. The device of claim 8, wherein the column selection line voltage is generated by using a peripheral circuit reference voltage or an array reference voltage.

12. The device of claim 11, wherein the column selection line voltage generator comprises:
    a voltage divider circuit to divide the internal peripheral circuit reference voltage or internal array reference voltage;
    a differential amplifier that differentially amplifies a first node voltage in the voltage divider circuit and a voltage of a column selection line voltage output node; and
    a current driving transistor that provides current to the column selection line voltage output node.

13. The device of claim 12, wherein the column selection line voltage generator further comprises a fuse to connect a second node and a third node in the voltage divider circuit.

14. The device of claim 12, wherein the column selection line voltage generator further comprises a transistor connected between the second node and the third node in the voltage divider circuit, which is turned on/off in response to a mode resister set signal.

15. The device of claim 8, wherein the column selection unit comprises:
- a decoder to decode and output a decoded version of the column address signal; and
- a column selection line driver to generate the column selection line signal based at least in part upon an output signal from the decoder and the column selection line voltage.

16. The device of claim 15, wherein the column selection line driver comprises:
- a first inverter, powered by an internal peripheral circuit source voltage, to invert the output signal from the decoder; and
- a second inverter, powered by the column selection line voltage, to invert an output signal from the first inverter and so produce the column selection line signal.

17. The device of claim 8, wherein the input/output sense amplifiers are current sense amplifiers.

18. A semiconductor memory device comprising:
- a column selection line voltage generator that generates a column selection line voltage;
- a column selection line driver to provide a column selection line signal based upon the column selection line voltage level and a given one of an internal peripheral circuit source voltage and an internal array source voltage; and
- a switching unit to selectively connect a bitline pair and a pair of input/output lines in response the column selection line signal.

19. The device of claim 18, wherein the column selection line driver includes:
- a first device, powered by the given one of the internal peripheral circuit source voltage and the internal array source voltage, to manipulate a column address signal and produce an intermediate signal; and
- a second device, powered by the column selection line voltage level, to manipulate the intermediate signal and produce the column selection line signal.

* * * * *